United States Patent [19]

Tosaka et al.

[11] Patent Number: 5,981,154
[45] Date of Patent: Nov. 9, 1999

[54] SILVER HALIDE COLOR PHOTOGRAPHIC LIGHT-SENSITIVE MATERIAL

[75] Inventors: Yasuo Tosaka; Susumu Ohkawachi; Masayuki Sasagawa, all of Odawara, Japan

[73] Assignee: Konica Corporation, Japan

[21] Appl. No.: 08/939,268

[22] Filed: Sep. 29, 1997

Related U.S. Application Data

[63] Continuation of application No. 08/586,957, Jan. 16, 1996, abandoned.

[30] Foreign Application Priority Data

Jan. 20, 1995 [JP] Japan .................................. 7-007360

[51] Int. Cl.⁶ ...................................................... G03C 1/46
[52] U.S. Cl. .......................... 430/504; 430/503; 430/505; 430/571; 430/944
[58] Field of Search ..................................... 430/503, 504, 430/505, 571, 944, 363, 364, 358

[56] References Cited

U.S. PATENT DOCUMENTS

| | | | |
|---|---|---|---|
| 5,185,237 | 2/1993 | Kawai | 430/944 |
| 5,232,826 | 8/1993 | Bucci et al. | 430/944 |
| 5,413,902 | 5/1995 | Hara et al. | 430/944 |
| 5,541,040 | 7/1996 | Okawauchi et al. | 430/506 |

FOREIGN PATENT DOCUMENTS 0588641  3/1994  European Pat. Off. .

OTHER PUBLICATIONS

Patent Abstracts of Japan (1 pg) Publ. #JP5134350 Publication Date: May 28, 1993.

*Primary Examiner*—Geraldine Letscher
*Attorney, Agent, or Firm*—Jordan B. Bierman; Bierman, Muserlian and Lucas

[57] ABSTRACT

A silver halide color photographic material is disclosed which comprises a support and provided thereon, a first silver halide emulsion layer comprising at least one yellow image forming silver halide emulsion, a second silver halide emulsion layer comprising-at least one magenta image forming silver halide emulsion and a third silver halide emulsion layer comprising at least one cyan image forming silver halide emulsion, wherein at least one of said first, second and third silver halide emulsion layers further contains a fourth silver halide emulsion, each one of said first, second, third and fourth silver halide emulsions has a spectral sensitivity wavelength region at least six times higher than that in the wavelength region of the other three emulsions, and said fourth silver halide emulsion gives an optical density after development of 0.7 or more.

6 Claims, No Drawings ns subjected to color separation and halftone image conversion...

SILVER HALIDE COLOR PHOTOGRAPHIC LIGHT-SENSITIVE MATERIAL

This application is a continuation of application Ser. No. 08/586,957, filed Jan. 16, 1996, now abandoned.

FIELD OF THE INVENTION

The present invention relates to a silver halide color photographic light-sensitive material suitable for use in preparing color proofs from plural pieces of halftone image information which are obtained by subjecting original images to color separation and halftone image conversion treatments in the color graphic arts/printing process.

BACKGROUND OF THE INVENTION

There are methods for forming color images by using photo-polymers or diazo compounds, called the overlay method and the surprint method, which are conventionally known as the methods for making color proofs from plural black-and-white halftone images prepared by subjecting originals to color separation and halftone image conversion treatments in the color graphic arts/printing process.

The overlay method is very simple, inexpensive for proof preparation, and advantageous in that all what has to be done for color proof reading is superpose film sheets for four different colors (subtractive three primary colors plus black), but has the disadvantage that the superposition of the film sheets brings about gloss, thus leading to providing an image quality different from that of the resulting print.

The surprint method is to superpose colored images on a support, and as the method there are those for forming a colored image by toner development, utilizing the adhesion property of a photopolymerizable material, as described in U.S. Pat. Nos. 3,582,327, 3,607,264 and 3,620,726.

Japanese Patent Examined Publication (hereinafter abbreviated to JP E.P.) No. 27441/1972 and Japanese Patent Open to Public Inspection (hereinafter abbreviated to JP O.P.I.) No. 501217/1981 describe another color proof making method in which a light-sensitive colored sheet is used to have its layer transferred onto a support, exposed and developed to form an image, then on the formed image layer is provided another light sensitive colored sheet's layer to be subjected to similar process, and then repeating similar procedures, whereby a color proof is prepared.

JP O.P.I. No. 97140/1984 describes a method in which a colored light-sensitive sheet is exposed through a corresponding color-separation image film and developed to thereby form a colored image to be transferred onto a support, which is followed by forming and transferring onto the colored image in sequence different other colored images in the same manner, whereby a complete color image is formed on the support. For the toners and coloring agents for use in the formation of the above color image there may be used similar coloring materials to those for making printing inks, so that the resulting colors of the obtained color proof prepared by using them near those of actual prints.

The above-mentioned methods, however, require much labor for superposing and transferring images onto a support in the color proof making process, so that they have the disadvantage that they take time and are costly.

For solution to the above problems JP O.P.I. Nos. 113139/1981, 104335/1981, 280746/1987, 280747/1987, 280748/1987, 280749/1987, 280750/1987 and 280849/1987 disclose methods for making color proofs by use of a silver halide color photographic light-sensitive material having a white support.

The method disclosed in the above publications is such that a plural number of color-separated black-and-white halftone dot images obtained by the color separation/halftone image conversion of a colored original are printed in sequence in the contact printing manner onto a single sheet of color photographic paper, which is then subjected to color development to thereby form a color image composed of dyes produced from the couplers; the thus formed color image is used as a color proof.

However, this technique has the following shortcomings. When a color proof is prepared so that a color image is brought close to that of original print, the density of black images such as characters is insufficient compared to that of the original print, and when a color proof is prepared so that the black image density is enhanced to be close to that of the original print, closeness to the original print of the color image deteriorates. Therefore, it is difficult to obtain a color proof satisfying both image criteria.

In order to overcome the above shortcomings, a light sensitive material is disclosed in JP O.P.I. No. 2-212835/1990 which comprises a yellow layer, a magenta layer and a cyan layer, each layer having a spectral sensitivity wavelength region different from each other and a common spectral sensitivity wavelength region. As is apparent from the description, the density of the emulsion having common sensitivity wavelength can not attain a black image density and even if Y, M, C densities are added, only a density of about 0.3 is added. Therefore, in order to obtain the sufficient density, when exposure is carried out through a yellow image original, through a magenta image original, and through a cyan image original in close contact with light sensitive material, exposure-is carried out through a black dot image original together with the yellow, magenta or cyan dot image original. As a result, reproducibility of either a small black image dot or a small monochromatic image dot deteriorates which is obtained by exposing through a black image or monochromatic image original being farthest from the light sensitive layer. A technique is disclosed in JP O.P.I. No. 61-233732/1986 which comprises, in addition to a yellow color layer, a magenta color layer and a cyan color layer, a fourth black layer having a maximum spectral sensitivity wavelength different from the other layers. This technique has the disadvantages that the four layer coating is a complex production process, the emulsion thickness increases, resulting in deterioration of image sharpness, and further, exact reproduction of image information is difficult. A technique is disclosed in JP O.P.I. No. 5-134350/1993, which reproduces, both black image and color image by a yellow color layer, a magenta color layer and a cyan color layer. The technique requires exposing to light through both black image original and color image original in close contact with the light sensitive material, and the close contact with any of the originals is insufficient, resulting in deterioration of small-dot reproduction in a black or color image. Further, black image portions are not distinguished from image portions consisting of a combined three color images, that is, yellow, magenta and cyan color images, and there is practically a problem in exact reproduction of shadow image portions.

SUMMARY OF THE INVENTION

Accordingly, an object of the invention is to provide a silver halide color photographic light sensitive material for color proof which is capable of giving a color proof having improved closeness to print image quality and a stable tone image, when a color proof is prepared from halftone image information obtained by color separation and halftone image conversion, and to provide a method for preparing a color proof employing the same.

DETAILED DESCRIPTION OF THE INVENTION

The above object of the invention could be attained by the following constitutions:

1) a silver halide color photographic material comprising a support and provided thereon, a first silver halide emulsion layer comprising at least one yellow image forming silver halide emulsion (Y emulsion), a second silver halide emulsion layer comprising at least one magenta image forming silver halide emulsion (M emulsion) and a third silver halide emulsion layer comprising at least one cyan image forming silver halide emulsion (C emulsion), wherein at least one of said yellow, magenta and cyan image forming silver halide emulsion layers further contains a fourth silver halide emulsion (S emulsion), one of the Y, M, C, and S emulsions has a spectral sensitivity wavelength region at least six times higher than the other three emulsions, and the optical density after development of the S emulsion is 0.7 or more, 2) the silver halide color photographic material of 1) above, wherein all of said yellow, magenta and cyan image forming silver halide emulsion layers further contain the S emulsion, 3) a positive working silver halide photographic material comprising a reflective support and provided thereon, a first silver halide emulsion layer comprising at least one yellow image forming silver halide emulsion (Y emulsion), a second silver halide emulsion layer comprising at least one magenta image forming silver halide emulsion (M emulsion) and a third silver halide emulsion layer comprising at least one cyan image forming silver halide emulsion (C emulsion), wherein at least one of said yellow, magenta and cyan image forming silver halide emulsion layers further contains a fourth silver halide emulsion (S emulsion), one of the Y, M, C, and S emulsions has a spectral sensitivity wavelength region at least six times higher than the other three emulsions, and a first reflective layer of the support or a second reflective layer coated on the emulsion layer side of the support contains white pigment in an amount of 20 weight % or more based on the binder of the first or second reflective layer, 4) the positive working silver halide photographic material of 1), 2) or 3) above, wherein the support is a reflective support, the support has a first reflective layer or a second reflective layer coated on the emulsion layer side of the support, each containing white pigment in an amount of 20 weight % or more based on the binder of the first or second reflective layer, or 5) a method for preparing a color proof, comprising exposing a silver halide color photographic material comprising a support and provided thereon, a yellow image forming layer, a magenta image forming layer and a cyan image forming layer in accordance with a dot image of color separated yellow image information, a dot image of color separated magenta image information, a dot image of color separated cyan image information and a dot image of black image information, wherein said silver halide color photographic material is the silver halide color photographic material of 1), 2), 3) or 4).

Next, the invention will be explained in detail.

In the invention the silver halide color photographic material comprises a support and provided thereon, a first silver halide emulsion layer comprising at least one yellow image forming silver halide emulsion (Y emulsion), a second silver halide emulsion layer comprising at least one magenta image forming silver halide emulsion (M emulsion) and a third silver halide emulsion layer comprising at least one cyan image forming silver halide emulsion (C emulsion), wherein at least one of said yellow, magenta and cyan image forming silver halide emulsion layers further contains a fourth silver halide emulsion (S emulsion). Further, when a spectral sensitivity of one of the Y, M, C, and S emulsions is measured, the sensitivity has a spectral sensitivity wavelength region at least six times higher than the other three emulsions.

In one preferable embodiment each of the Y, M, C, and S emulsions has a maximum spectral sensitivity in a different spectral sensitivity wavelength region. When a light-sensitive material is exposed with a specific light giving around maximum value in a spectral sensitivity wavelength region of one of Y, M, C and S emulsions, the exposed emulsion has a spectral sensitivity wavelength region at least six times higher than the other three emulsions. All of Y, M, C and S emulsions have such a spectral sensitivity wavelength region in a wavelength region giving around maximum value in the spectral sensitivity wavelength region.

In another preferable embodiment in a spectral sensitivity wavelength region of one of Y, M, C and S emulsions, a spectral sensitivity wavelength region having a sensitivity at least six times higher than the other three emulsions is present at other than a wavelength region giving around maximum value. In such case, a sensitivity difference between the emulsions of at least six times can be used.

In the invention at least one of a yellow, magenta and cyan image forming layers contains S emulsion in the invention, and preferably all of a yellow, magenta and cyan image forming layers contain the S emulsion. When S emulsion in the yellow layer is designated as SY emulsion, S emulsion in the magenta layer as SM emulsion, and S emulsion in the cyan layer as SC emulsion, it is preferable that the requirements of the invention are satisfied between SY emulsion and a Y, M and C emulsions, between SM emulsion and a Y, M and C emulsions or between SC emulsion and a Y, M and C emulsions. In such cases, the spectral sensitivity region of the SY emulsion giving at least six times sensitivity, the spectral sensitivity region of the SM emulsion giving at least six times sensitivity and the spectral sensitivity region of the SC emulsion giving at least six times sensitivity are preferably the same, and may be different from each other. In the latter, the object of the invention can be attained by exposing using a light of the respective different wavelength.

In the preferable embodiment Y, M, C and S emulsions have a different spectral sensitivity wavelength region and a different maximum sensitivity wavelength. The maximum sensitivity wavelength is different by preferably 20 nm or more and more preferably 30 nm or more.

The maximum sensitivity wavelength of the Y, M, C and S emulsions may be any so far as the above requirement is satisfied. The maximum sensitivity wavelength of each emulsion can be selected from the range of from 350 to 900 nm. One preferable embodiment includes emulsions wherein Y emulsion is a blue sensitive layer, M emulsion is a green sensitive layer, C emulsion is a red sensitive layer, and S emulsion is a infrared sensitive layer. Another preferable embodiment includes emulsions wherein Y emulsion is a 400±30 nm spectral sensitive layer, M emulsion is a 460±30 nm spectral sensitive layer, C emulsion is a 540±30 nm spectral sensitive layer, and S emulsion is a 640±30 nm spectral sensitive layer, and the maximum sensitivity wavelength difference between each emulsion is 20 nm or more.

Still another preferable embodiment includes emulsions wherein the maximum sensitivity wavelength of C emulsion, Y emulsion, M emulsion and S emulsion is 580 nm, 660 nm, 750 nm and 850 nm, respectively. Further still another preferable embodiment includes emulsions wherein the maximum sensitivity wavelength of Y emulsion, M emulsion, C emulsion and S emulsion is 540 nm, 380 nm, 460 nm and 630 nm, respectively. However, the above samples are only an example, and the invention is not limited thereto.

The each emulsion selected from the Y, M, C and S emulsions have a spectral sensitivity wavelength region at least six times, and preferably eight times higher than a spectral sensitivity in the sensitivity wavelength the other emulsions other than the emulsion have. The sensitivity herein referred to is represented by inverse of exposure necessary to obtain a density of (maximum density—0.3).

The Y, M, C and S emulsions in the invention can be sensitized with the conventional sensitizers.

The light sensitive material in the invention is preferably a positive working light sensitive material. The positive working light sensitive material includes a light sensitive material employing a direct positive process or a color reversal process, a light sensitive material employing a silver dye bleach process to obtain a positive image by bleaching a dye at the same time the silver in an imagewise formed silver image is bleached and a light sensitive material employing a color diffusion transfer process.

The silver halide grain diameter of the respective emulsion layers of the silver halide photographic light-sensitive material of the invention can be determined according to the characteristics required therefor, particularly taking into account various characteristics such as the sensitivity, sensitivity balance, color separation, sharpness and graininess.

In a preferred embodiment of the invention, the silver halide grain diameter is preferably 0.1 $\mu$m to 1.2 $\mu$m.

As the silver halide emulsion of the invention there may be used a surface latent image-type silver halide emulsion that is imagewise exposed to form a latent image on its surface, and processed to thereby form a negative image. And there may also be suitably used an internal latent image-type silver halide emulsion having its grain surface previously unfogged which, after being imagewise exposed, is subjected to fogging treatment (nucleus-making treatment) followed by surface development or which, after being imagewise exposed, is subjected to surface development while being subjected to fogging treatment to thereby obtain a direct positive image.

The above fogging treatment may be achieved by having the emulsion overall exposed to light, chemically fogged with a fogging agent, processed in a strong developer solution or subjected to heat treatment. The aforementioned internal latent image-type silver halide grains-containing emulsion is an emulsion containing silver halide crystal grains each having a sensitivity speck mainly there inside to form an internal latent image when exposed to light.

In the technological field of the internal latent image type direct positive emulsion, there have been known to date various techniques such as, for example, those described in U.S. Pat. Nos. 2,592,250, 2,466,957, 2,497,875, 2,588,982, 3,761,266, 3,761,276 and 3,796,577; and British Patent No. 1,151,363.

The positive image forming mechanism is not entirely clear. However, the 'Photographic Science and Engineering,' vol. 20, p.158 91976) describes about the mechanism as follows:

The photoelectrons produced inside a silver halide crystal grain by imagewise exposure are selectively captured inside the grain to thereby form an internal latent image. The internal latent image acts as an effective capture center to the electrons in the conduction band, so that in an exposed grain, the electrons poured in the subsequent fogging/developing process are to be captured inside the grain to thereby intensify the latent image. In this instance, the latent image rests so deep inside the grain that it is not developed by surface development. On the other hand, in a grain not imagewise exposed, at least part of the electrons are captured to the grain surface to thereby form a latent image thereon, so that the grain is developed by surface development.

The previously unfogged internal image-type silver halide emulsion usable in the invention is an emulsion containing silver halide grains each forming a latent image mainly there inside and having most of sensitivity specks there inside, and it includes silver bromide, silver chloride, silver chlorobromide, silver chloroiodide, silver iodobromide, and silver chloroiodobromide.

The above emulsion is most preferably one which is such that when it is coated on a support so that its silver coating weight is in the range of about 1 to 3.5 g/m$^2$ to prepare a sample, and when one partial piece of the prepared sample is subjected to light intensity scale exposure for specified periods of time ranging from 0.1 to 1.0 second and developed at 20° C. for 4 minutes in the following surface developer solution A substantially not containing any silver halide solvent for developing the surface image alone of the grain, the maximum density of the thus processed piece is not more than ⅕ of the maximum density of the other part of the same sample that is obtained by being exposed likewise and developed at 20° C. for 4 minutes in the following internal developer B capable of developing the latent image inside the grain.

| (Surface developer solution A) | |
| --- | --- |
| Metol | 2.5 g |
| L-ascorbic acid | 10.0 g |
| Sodium metaborate, tetrahydrate | 35.0 g |
| Potassium bromide | 1.0 g |
| Water to make | 1000 cc |
| (Internal developer solution B) | |
| Metol | 2.0 g |
| Anhydrous sodium sulfite | 90.0 g |
| Hydroquinone | 8.0 g |
| Sodium carbonate, monohydrate | 52.5 g |
| Potassium bromide | 5.0 g |
| Potassium iodide | 0.5 g |
| Water to make | 1000 cc |

The internal latent image-type silver halide emulsion suitably usable in the invention include those prepared in various methods, such as the conversion-type silver halide emulsion described in U.S. Pat. No. 2,592,250; the silver halide emulsion comprising internally chemically sensitized silver halide grains described in U.S. Pat. Nos. 3,206,316, 3,317,322 and 3,367,778; the emulsion containing polyvalent metallic ion-incorporated silver halide grains described in U.S. Pat. Nos. 3,271,157 and 3,447,927; the silver halide emulsion comprising weakly chemically sensitized silver halide grains containing a doping agent described in U.S. Pat. No. 3,761,276; the silver halide emulsion comprising grains having multiphase structure described in JP O.P.I. Nos. 8524/1975, 38525/1975 and 2408/1978; and the silver halide emulsion described in JP O.P.I. Nos. 156614/1977 and 127549/1980.

The internal latent image-type silver halide grain usable in the invention may be of any arbitrary silver halide such as silver bromide, silver chloride, silver chlorobromide, silver chloroiodide, silver iodobromide or silver chloroiodobromide. The silver chloride grain is excellent in the developability and suitable for rapid processing.

The silver halide crystal grain used in the invention may have any form such as a cubic form, an octahedral form, a tetradecahedral form comprised of a mixture of (100) and (111) planes, a form having (110) planes, a spherical form or a tabular form. Suitably usable silver halide grains are ones having an average grain diameter of 0.05 to 3µm. The silver halide emulsion used in the invention may be either a monodisperse emulsion comprising grains having uniform grain diameters or uniform crystal habits or a polydisperse emulsion comprising grains whose grain diameters or crystals habits are not uniform. In the invention, the monodisperse silver halide emulsion is one in which the weight of the silver halide grains having a grain diameter within the limit of its average diameter rm±20% accounts for preferably not less than 60%, more preferably not less than 70%, and most preferably not less than 80% of the total weight of the whole silver halide grains thereof. The average grain diameter rm herein is defined as the grain diameter ri in the case where the product of frequency ni of the grain having a grain diameter ri and $ri^3$, i.e., $ni \times ri^3$, comes to the maximum (round to three decimal places), wherein the grain diameter, in the case of a spherical silver halide grain, is the diameter itself, while in the case of a non spherical grain, is the diameter of a circular image equivalent in the area to the projection image of the grain. The grain diameter can be obtained by a method in which the grain is electron microphotographically 10,000-fold to 50,000-fold enlarged, and the diameter of the enlarged grain image on its photo print or the area of the projection grain image enlarged likewise is actually measured. (The number of grains for measurement shall be 1000 or more at random.)

The most preferred highly monodisperse emulsion is of silver halide grains having a grain diameter distribution broadness of not more than 20%, the distribution broadness being defined by Grain diameters standard deviation/average diameter× 100=distribution broadness (%)

wherein the above average grain diameter and the grain diameter standard deviation are to be found from the earlier defined ri.

The monodisperse emulsion can be obtained by adding an aqueous silver salt solution and an aqueous halide solution under controlled pAg and pH conditions according to a double-jet precipitation method. For determination of the adding rate, reference can be made to JP O.P.I. Nos. 48521/1979 and 49938/1983. To obtain a highly monodisperse emulsion there can be used the method for growing the grain in the presence of a tetrazaindene compound disclosed in JP O.P.I. No. 122935/1985.

In the invention S emulsion can be contained in a yellow layer, a magenta layer or a cyan layer. In one preferable example S emulsion is contained in all of a yellow layer, a magenta layer and a cyan layer. In another preferable example when S emulsion is contained in a yellow layer containing a Y emulsion, Y emulsion and S emulsion may be contained in the same or different layer.

Similarly, when S emulsion is contained in a magenta layer, M emulsion and S emulsion may be contained in the same layer or in different layers. When in different layers, the layers may be provided adjacent to each other or through an intermediate layer or another layer. The same applies to a cyan layer. The optical density of S emulsion is preferably 0.7 or more. The optical density in the invention is measured according to the following method.

(Exposure condition-Y)

The test sample is exposed to light having a spectral sensitivity wavelength of Y emulsion for 0.5 seconds at a minimum exposure giving a minimum absolute value of Y density variation after development to exposure (logarithm) variation. When the minimum absolute value is not obtained, the sample is exposed to light having a spectral sensitivity wavelength of Y emulsion for 0.5 seconds at a minimum exposure giving a minimum Y density after development.

(Exposure condition-M)

The test sample is exposed to light having a spectral sensitivity wavelength of M emulsion for 0.5 seconds at a minimum exposure giving a minimum absolute value of M density variation after development to exposure (logarithm) variation. When the minimum absolute value is not obtained, the sample is exposed to light having a spectral sensitivity wavelength of M emulsion for 0.5 seconds at a minimum exposure giving a minimum M density after development.

(Exposure condition-C)

The test sample is exposed to light having a spectral sensitivity wavelength of C emulsion for 0.5 seconds at a minimum exposure giving a minimum absolute value of Y density variation after development to exposure (logarithm) variation. When the minimum absolute value is not obtained, the sample is exposed to light having a spectral sensitivity wavelength of C emulsion for 0.5 seconds at a minimum exposure giving a minimum C density after development.

(Exposure condition-S)

The test sample exposed with the above exposure conditions Y, M, and C in this order is exposed to light having a spectral sensitivity wavelength of S emulsion for 0.5 seconds at a minimum exposure giving a minimum visible light density after development. The exposure to light having a spectral sensitivity wavelength of S emulsion refers to Exposure condition-S.

The share density of S emulsion in the invention is measured according to the following method.

The test sample is exposed with the above exposure conditions Y, M, and C in this order and developed. The Y, M, and C density of the developed image is designated as Y1, M1 and C1, respectively.

The test sample is exposed with the above exposure conditions Y, M, C and S in this order and developed. The Y, M, and C density of the developed image is designated as Y2, M2 and C2, respectively. The share density of S emulsion in the invention is represented by Y1–Y2, M1–M2, and C1–C2. One of them is preferably 0.7 or more, more preferably 0.8 or more and still more preferably 1.0 or more. Or all of Y1–Y2, M1–M2, and C1–C2 is preferably 0.7 or more.

In order to realize the share density of S emulsion in the invention, the silver coating amount and coupler coating amount in S emulsion can be adjusted.

When S emulsion in the invention is contained in a yellow layer, S emulsion may be contained in the same layer as the Y emulsion or a yellow layer different from a yellow layer containing Y emulsion. S emulsion is preferably contained in the same layer as the Y emulsion in view of coating convenience, but S emulsion is also preferably contained in a different layer in view of easily determining a share density. The silver coating amount of S and Y emulsion can be optionally selected by adjusting a yellow density of Y emulsion and a share density of S emulsion.

Similarly, when S emulsion is contained in a magenta or cyan layer, the same as in the above Y emulsion applies. It is preferable that S emulsion is contained in all of yellow, magenta and cyan layers.

In the invention at least one reflective layer containing white pigment is provided on the image forming side of a support, and the white pigment content of the layer is preferably 20 weight % or more based on the binder content.

The reflective layer of a support in the invention includes a polyolefin resin coating layer containing white pigment and a hydrophilic colloid layer containing white pigment provided on the support.

The polyolefin resin coating layer as a reflective layer may contain white pigment in an amount of 20 to 40 weight % or more based on the binder content. When a resin capable of hardening with ultra a violet light or an electronic light is used as a binder, the white pigment content may be contained in a reflective layer in a relatively high content.

In the invention a hydrophilic colloid layer containing white pigment is preferably used as a reflective layer, wherein the white pigment content may be contained in an amount of preferably 20 to 80 weight % or more, and more preferably 30 to 70 weight % based on the binder content.

As the white pigment there may be used an inorganic and/or an organic white pigment, preferably an inorganic white pigment. Examples of the white pigment include sulfates of alkaline earth metals such as barium sulfate, carbonates of alkaline earth metals such as calcium carbonate, powdery silicic acid, synthetic silicates, calcium silicate, alumina, alumina hydrate, titanium oxide, zinc oxide, talc, clay, and the like.

The suitable among them are preferably barium sulfate, calcium carbonate and titanium oxide, more preferably barium sulfate and titanium oxide.

The titanium oxide used may be of either the rutile type or the anatase type, and may also be one having its surface coated with a metal oxide such as water-containing alumina oxide or water-containing ferrite oxide.

The above white pigment may be used in a mixture with additives such as a colored pigment, a brightening agent, an antioxidant and the like.

The coating weight of the white pigment is in the range of preferably 1 to 50 g/m$^2$, more preferably 2 to 20 g/m$^2$.

As a coupler used in the silver halide light sensitive material in the invention is used any compound capable of forming a coupling product having a maximum spectral sensitivity wavelength in a wavelength region longer than 340 nm on coupling reaction with an oxidation product of a color developing agent. The typical coupler includes a yellow coupler having a maximum spectral sensitivity wavelength in a range of 350 to 500 nm, a magenta coupler having a maximum spectral sensitivity wavelength in a range of 500 to 600 nm, and a cyan coupler having a maximum spectral sensitivity wavelength in a range of 600 to 750 nm.

The cyan coupler preferably used in the light sensitive material in the invention includes a coupler represented by formula (C-I) or (C-II) described on page 17, and exemplified compounds represented by CC-1 through CC-9 described on pages 18–21 of Japanese Patent O.P.I. Publication No. 4-114152/1992.

The magenta coupler preferably used in the light sensitive material in the invention includes a coupler represented by formula (M-I) described on page 12, and exemplified compounds represented by MC-1 through MC-7 described on pages 13–16 of Japanese Patent O.P.I. Publication No. 4-114152/1992.

The yellow coupler preferably used in the light sensitive material in the invention includes a coupler represented by formula (Y-I) described on page 8, and exemplified compounds represented by YC-1 through YC-9 described on pages 9–11 of Japanese Patent O.P.I. Publication No. 4-114152/1992. Of these YC-8 and YC-9 on page 11 are preferable in view of forming an excellent yellow dye.

When a coupler is added to a silver halide photographic light sensitive material in the invention using an oil in water type emulsifying method, the coupler is usually dissolved in a water-insoluble, high boiling point organic solvent having a boiling point of 150° C. or more, a low boiling point and/or water soluble organic solvent being optionally added, the solution is added to a hydrophilic binder solution such as a gelatin solution, and then emulsified using a surfactant. The emulsifying means includes a stirrer, a homogenizer, a colloid mill, a flow-jet mixer and a ultrasonic emulsifier. The process removing a low boiling point organic solvent may be added during or after the emulsification. AS a high boiling point organic solvent used for dissolving and emulsifying a coupler, phthalates such as dioctyl phthalate or phosphates such as tricresyl phosphate are preferable.

Beside the method employing a high boiling point organic solvent, a method is used in which a coupler and a water insoluble and organic solvent soluble polymer are dissolved optionally in a low boiling point and/or water soluble organic solvent and emulsified in a hydrophilic binder solution such as a gelatin solution, using a surfactant. The water insoluble and organic solvent soluble polymer includes poly(N-t-butylacrylamide).

For the purpose of shifting an absorption wavelength of a color dye compound (d-11) described on pages 33 and compound (A'-1) described on pages 35 of Japanese Patent O.P.I. Publication No. 4-114152/1992 can be used. Besides the compounds, a fluorescent dye releasing compound disclosed in U.S. Pat. No. 4,774,187 are used.

The fogging treatment in the internal latent image-type direct positive image formation suitably applicable to the invention can be effected by giving an overall exposure or by using a compound capable of forming a fog speck, i.e., a fogging agent.

The overall exposure is made in the manner that an imagewise exposed light-sensitive material, after being immersed in a developer solution or other aqueous solution or moistened by any arbitrary means, is uniformly overall exposed to light. The light source to be used in this instance is allowed to be of any kind as long as it emits a light belonging to the spectral wavelength region to which the above light-sensitive material is sensitive, said light including a flash light for high intensity/short-time exposure and a weak light for long-time exposure. The overall exposure time may be varied according to the photographic light-sensitive material used, the processing conditions, the type of the light source used, and the like, so as to be able to finally obtain the best positive image. For the overall exposure it is most preferable for the light-sensitive material to use an exposure amount within certain specified limits. Normally, the use of an over exposure amount brings about a rise of the minimum density or desensitization of the light-sensitive material, resulting in image quality degradation.

The fogging agent preferably usable in the invention is explained.

The fogging agent used in the invention includes diverse compounds. The fogging agent need only be present at the time of developing; for example, it may be present in the nonsupport component layer, preferably in the silver halide emulsion layer, of the photographic light-sensitive material, or alternatively in a developer bath or in a processing solution prior to the developer bath. The using amount of the fogging agent necessary when adding it to the silver halide emulsion layer is preferably 1 to 1,500 mg, more preferably 10 to 1,000 mg per mol of silver halide, while when adding it to a processing solution such as a developer solution, the amount is preferably 0.01 to 5 g/liter, and most preferably 0.05 to lg/liter.

Examples of the fogging agent include compounds having groups adsorbable to the surface of silver halide such as the hydrazines described in U.S. Pat. Nos. 2,563,785 and 2,588,982; the hydrazide and hydrazine compounds described in U.S. Pat. No. 3,227,552; the heterocyclic quaternary nitrogen-containing compounds; and the acylhydrazinophenylthioureas described in U.S. Pat. No. 4,030,925. These fogging agents may be used in combination. For example, Research Disclosure 15162 describes the combination of a nonadsorptiontype fogging agent with an adsorption-type fogging agent, and the technique of this combination is effective also in the invention. The fogging agent used in the invention may be either of the adsorption type or of the nonadsorption type, and may be used in combination of these compounds of both types.

Useful examples of the fogging agent include hydrazine compounds such as hydrazine hydrochloride, 4-methylphenylhydrazine hydrochloride, 1-acetyl-2-phenylhydrazine, 1-formyl-2-(4-methylphenyl)hydrazine, 1-methylsulfonyl-2-phenylhydrazine, 1-methylsulfonyl-2-(3-phenylsulfonamidophenyl)hydrazine, 1-benzoyl-2-phenylhydrazine and formaldehydophenylhydrazine; N-substituted quaternary cycloammonium salts such as 3-(2-formylethyl)-2-methylbenzothiazolium bromide, 3-(2-acetylethyl)-2-benzylbenzooxazolium bromide, 3-(2-acetylethyl)-2-benzylbenzoselenazolium bromide, 2-methyl-3-[3-(phenylhydrazino)propyl]-benzethiazolium bromide, 1,2-dihydro-3-methyl-phenylpyrido-[2,1-b] benzothiazolium bromide, 1,2-dihydro-3-methyl-4-phenylpyrido[2,1-b]benzoselenazolium bromide and 4,4'-ethylenebis-(1,2-dihydro-3-methylpyrido[2,1-b] benzothiazolium) bromide; and 5-(3-ethyl-2-benzothiazolinylidene)-3-[4-(2-formylhydrazino)phenyl] phenyl] rhodanine, 1,3-bis[4-(2-formylhydrazino)-phenyl] thiourea, 7-(3-ethoxythiocarbonylaminobenzamido)-9-methyl-10-propargyl-1,2,3,4-tetrahydroacrydiniumtrifluoromethane sulfonate, 1-formyl-2-[4-{3-(2-methoxyphenyl)ureido}phenyl]-hydrazine and the like.

The photographic light-sensitive material having the silver halide emulsion layer of the invention, after being imagewise exposed, is either overall exposed or developed in the presence of a fogging agent, thereby forming a direct positive image.

The developing agent usable in the developer solution for use in developing the photographic light-sensitive material of the invention include ordinary silver halide developing agents such as hydroquinone, hydroxybenzenes, aminophenols, 3-pyrazolones, ascorbic acid and its derivatives, reductones, phenylenediamines, and mixtures thereof; to be concrete, hydroquinone, aminophenol, N-methylaminophenol, 1-phenyl-3-pyrazolidone, 1-phenyl-4,4-dimethyl-3-pyrazolidone, 1-phenyl-4-methyl-4-hydroxymethyl-3-pyrazolidone, ascorbic acid, N.N-diethylaminotoluidine, 4-amino-3-methyl-N-ethyl-N-(p-methanesulfonamidoethyl)-aniline, 4-amino-3-methyl-N-ethyl-N-(β-hydroxyethyl)aniline and 4-amino-N-ethyl-N-(β-hydroxyethyl)aniline. It is possible to incorporate any of these fogging agents into the silver halide emulsion so as to have the fogging agent react with the silver halide while being immersed in a high pH aqueous solution.

The developer solution used in the invention may contain a further specific fogging agent and a development restrainer. Alternatively, it is possible to arbitrarily incorporate such photographic additives for a developer solution into the component layer(s) of the photographic light-sensitive material.

For the silver halide photographic light-sensitive material in the invention there may be used known photographic additives.

The above-mentioned known photographic additives include the following compounds described in Research Disclosure RD 17643 and RD 18716.

| Additives | RD 17643 | | RD 18716 | |
|---|---|---|---|---|
| | Page | Section | Page | Section |
| Chemical sensitizers | 23 | III | 648 | upper right |
| Sensitizing dyes | 23 | IV | 648 | upper right |
| Development accelerators | 29 | XXI | 648 | upper right |
| Antifoggants | 24 | VI | 649 | lower right |
| Stabilizers | 24 | VI | 649 | lower right |
| Antistain agents | 25 | VII | 650 | left to right |
| Image stabilizers | 25 | VII | | |
| UV absorbents | 25–26 | VII | 649 | right to |
| | | | 650 | left |
| Filter dyes | 25–26 | VII | 649 | right to |
| | | | 650 | left |
| Brightening agents | 24 | V | | |
| Hardeners | 26 | X | 651 | right |
| Coating aids | 26–27 | XI | 650 | right |
| Surfactants | 26–27 | XI | 650 | right |
| Plasticizers | 27 | XII | 650 | right |
| Sliding agents | 27 | XII | 650 | right |
| Antistatic agents | 27 | XII | 650 | right |
| Matting agents | 28 | XVI | 650 | right |
| Binders | 29 | IX | 651 | right |

As a reflective support in the invention is preferably used a support for photographic print comprising a base material and provided thereon, a resin layer which is hardened by electron beam irradiation containing an inorganic or organic white pigment, which can give high smoothness and high image sharpness.

The electronic beam hardenable coating solution in the invention contains at least one organic compound capable of being hardened by electronic beam irradiation and pigment, preferably inorganic pigment as a main component, and optionally other additives. The organic compound capable of being hardened by electronic beam irradiation includes an unsaturated compound containing two or more double bonds in its molecule, for example, an acryl or methacryl oligomer, a multifunctional acryl or methacryl monomer, and an unsaturated compound containing at least one double bond in one molecule such as an acryl, methacryl or vinyl monomer. These unsaturated compounds produce radicals by electronic beam irradiation and polymerize, and form a cross-linkage by intramolecular and intermolecular crosslinking reactions to produce a hardened resin.

The acryl or methacryl oligomer includes an acryl or methacryl ester of polyurethane, an acryl or methacryl ester of polyetheralcohol, an acryl or methacryl ester of bisphenol A, and a maleic or fumalic ester of polyester. The multifunctional acryl or methacryl monomer includes 1,6-hexanedioldiacrylate, neopentyldiacrylate, diethyleneglycol diacrylate, butadieneacrylate, diethyleneglycol dimethacrylate, tetraethyleneglycol diacrylate, grycerolmethacrylate, stearylacrylate, polyethyleneglycol diacrylate, butoxyethylacrylate, 1,3-butanedioldiacrylate, ethyleneglycol dimethacrylate, glycidylmethacrylate, methylacrylate, ethylacrylate, butylacrylate, 2-hydroxyethylacrylate, 2-hydroxyethylmethacrylate, 2-hydroxypropylacrylate, phenoxyethylacrylate, cyclohexylacrylate, benzylacrylate, N,N-dimethylaminoethyl-acrylate, N,N-diethylaminoethylacrylate, ethyleneoxide modified phenoxyphosphoricacrylate, neopentylglycoldiacrylate, isocyanuric diacrylate, isocyanuric triacrylate, trimethylolpropanetriacrylate, propyleneoxide modified trimethylolpropanetriacrylate, glycidylmrthacrylate, 1,3-bis(N,N-diepoxypropylaminomethyl)cyclohexane, trimethylolpropanetriacrylate, pentaerythritolacrylate, and pentaerythritolpentaacrylate. The unifunctional acryl, methacryl or vinyl monomer includes styrene, N-vinylpyrrolidone, polyoxyethylenephnylalcohol acrylate, and 2-ethylhexylacrylate.

The coating solution contains pigment, usually white pigment which is uniformly mixed with an electronic beam hardenable organic compound. The white pigment includes titan dioxide (anatase or rutile type), barium sulfate, calcium carbonate, aluminium oxide, and magnesium oxide. Titan dioxide is treated with a metal oxide such as hydrated alumina whereby dispersibility is improved.

The white pigment content of the coating solution is designed to give 20 to 80 weight % based on the total weight of a hardenable resin layer. When the content is less than 20 weight %, sharpness of a photographic image on the print is not sufficient, and when the content exceeds 80 weight %, reflexibility of the resin layer deteriorates, resulting in layer separation. In order to disperse white inorganic pigment in the electron beam hardenable unsaturated organic compound, three roll mill, two roll mill, homogenizer, sand grinder and ultrasonic dispensing machine can be used.

The organic solvent includes acetone, methylethyl ketone, ethylacetate, butylacetate, ether, glycolmonoethyl ether, dioxane, benzene, toluene, xylene, ethylenechloride, carbon tetrachloride, chloroform, and dichlorobenzene.

The coating method includes a roller coating method and a conventional method used for sheet coating such as a bar coat method, a air-doctor coat method, a blade coat method, a squeeze coat method, a air-knife coat method, a reverse-roll coat method, a fountain coat method or a silt orifice coat method.

The electron beam irradiation machine is not specifically limited, and generally a curtain beam method, which is relatively cheap and gives large output, is used as an electron beam accelerator. On electron beam irradiation, the accelerating voltage is preferably 100–300 kv, and the absorbed dose is preferably 0.5–10 Mrad.

The thickness of the resin layer is 3–100 μm, and preferably 5–50 μm. When the thickness is outside this range, coating unevenness causes, too much energy is necessary for hardening or hardening is not sufficient, and problematic in quality.

Optionally the surface of a coating layer or after the hardening may be subjected to surface smoothing by a smooth roll and to surface matting by a silk or matting roll.

As the support in the invention, a conventional photographic support generally can be used, but paper is usually used. Paper used as a sheet-form support includes natural pulp paper, synthetic pulp paper, a mixture of natural pulp paper and synthetic pulp paper, and various combination paper. These paper supports may contain additives such as a sizing agent, a reinforcing agent, a filling agent, an antistatic agent, a pH adjusting agent, a pigment, and a dye which are used in paper manufacture. A surface sizing agent, a surface reinforcing agent and an antistatic agent may be coated on the surface of the material.

EXAMPLES

The invention is illustrated further in detail by the following examples, but the invention is not limited thereto.

Example 1

A paper support having one side thereof laminated with polyethylene and having the other side thereof laminated with polyethylene containing titanium oxide was used to coat the following component layers, whereby a multilayer color photographic light-sensitive material was prepared.
(Preparation of emulsion EM-1)

To an aqueous ossein gelatin solution at a temperature controlled to 40° C. were added both an aqueous ammoniacal silver nitrate solution and an aqueous potassium bromide and sodium chloride solution (at a molar KBr:NaCl ratio of 95:5) simultaneously in accordance with a controlled double-jet precipitation process, whereby a cubic silver chlorobromide core emulsion having an average grain diameter of 0.30 μm was obtained. During the above process, pH and pAg were controlled so as to enable the obtaining of cubic crystal grains. The obtained core emulsion had further an aqueous aimoniacal silver nitrate solution and an aqueous potassium bromide and sodium chloride solution (at a molar KBr:NaCl ratio of 40:60) added simultaneously thereto by the controlled double-jet precipitation process to thereby continue forming a shell phase to cover over the core grain of the above emulsion until the average grain diameter thereof comes to 0.42 μm. In this instance, pH and pAg were controlled so that cubic grains can be obtained.

To the above emulsion, after being washed to remove the water-soluble salts therefrom, gelatin was added to thereby obtain an emulsion EM-1. The distribution broadness of the grain diameters of the emulsion EM-1 was 8%.
(Preparation of emulsion EM-2)

To an aqueous osein gelatin solution at a temperature controlled to 40° C., were added both an aqueous ammoniacal silver nitrate solution and an aqueous potassium bromide and sodium chloride solution (at a molar KBr:NaCl ratio of 95:5) simultaneously according to the controlled double-jet precipitation process, whereby a cubic silver chlorobromide emulsion having an average grain diameter of 0.20 μm was obtained. In this instance, pH and pAg were controlled so that cubic silver halide grains can be obtained. The above-produced core emulsion had further an aqueous ammonical silver nitrate solution and an aqueous potassium bromide and sodium chloride solution (at a molar KBr:NaCl ratio of 40:60) added simultaneously thereto according to the controlled double-jet precipitation process to thereby continue forming a shell phase to cover over the above core grain until the average grain diameter comes to 0.28 μm, during which process pH and pAg were controlled so that cubic silver halide grains can be obtained.

To the above prepared emulsion, after being washed to remove the water-soluble salts therefrom, gelatin was added thereto to obtain an emulsion EM-2. The distribution broadness of the grain diameters of the emulsion EM-2 was 7%.
(Preparation of emulsion EM-3)

To an aqueous osein gelatin solution at a temperature controlled to 40° C. were added both an aqueous ammoniacal silver nitrate solution and an aqueous potassium bromide and sodium chloride solution (at a molar KBr:NaCl ratio of 95:5) simultaneously in accordance with a controlled double-jet precipitation process, whereby a cubic silver chlorobromide core emulsion having an average grain diameter of 0.15 μm was obtained. During the above process, pH and pAg were controlled so as to enable the obtaining of cubic crystal grains. The obtained core emulsion had further an aqueous ammoniacal silver nitrate solution and an aqueous potassium bromide and sodium chloride solution (at a molar KBr:NaCl ratio of 40:60) added simultaneously thereto by the controlled double-jet precipitation process to thereby continue forming a shell phase to cover over the core grain of the above emulsion until the average grain diameter thereof comes to 0.22 μm. In this instance, pH and pAg were controlled so that cubic grains can be obtained.

To the above emulsion, after being washed to remove the water-soluble salts therefrom, gelatin was added to thereby obtain an emulsion EM-3. The distribution broadness of the grain diameters of the emulsion EM-3 was 6%.
(Preparation of emulsion EM-4)

To an aqueous osein gelatin solution at a temperature controlled to 40° C., were added both an aqueous ammoniacal silver nitrate solution and an aqueous potassium bromide and sodium chloride solution (at a molar KBr:NaCl ratio of 45:45) simultaneously according to the controlled double-jet precipitation process, whereby a cubic silver chlorobromide emulsion having an average grain diameter of 0.25 μm was obtained. In this instance, pH and pAg were controlled so that cubic silver halide grains can be obtained. The above-produced core emulsion had further an aqueous ammonical silver nitrate solution and an aqueous potassium bromide and sodium chloride solution (at a molar KBr:NaCl ratio of 3:97) added simultaneously thereto according to the controlled double-jet precipitation process to thereby continue forming a shell phase to cover over the above core grain until the average grain diameter comes to 0.46 μm, during which process pH and pAg were controlled so that cubic silver halide grains can be obtained.

To the above prepared emulsion, after being washed to remove the water-soluble salts therefrom, gelatin was added thereto to obtain an emulsion EM-4. The distribution broadness of the grain diameters of the emulsion EM-4 was 6%.
(Preparation of blue-sensitive emulsion EM-B)

The emulsion EM-1 was spectrally sensitized by adding a sensitizing dye D-1 thereto, and a compound T-1 was added in an amount of 300 mg per mol of silver, whereby a blue-sensitive emulsion EM-B was prepared.
(Preparation of green-sensitive emulsion EM-G)

The emulsion EM-2 was spectrally sensitized by adding a sensitizing dye D-2 thereto, and a compound T-1 was added in an amount of 300 mg per mol of silver, whereby a green-sensitive emulsion EM-G was prepared.
(Preparation of red-sensitive emulsion Em-R)

The emulsion EM-3 was spectrally sensitized by adding sensitizing dyes D-3 and D-4 thereto, and a compound T-1 was added in an amount of 300 mg per mol of silver, whereby a red-sensitive emulsion EM-R was prepared.
(Preparation of infrared-sensitive emulsion EM-IR)

The emulsion EM-1 was spectrally sensitized by adding a sensitizing dye D-5 thereto, and a compound T-1 was added in an amount of 300 mg per mol of silver, whereby an infrared-sensitive emulsion EM-IR was prepared.
(Preparation of UV-sensitive emulsion EM-UV)

To emulsion EM-4 was added a compound in an amount of 400 mg per mol of silver, whereby a UV-sensitive emulsion EM-UV was prepared.

Compound T-1: 4-hydroxy-6-methyl-1,3,3a,7-tetrazaindene.

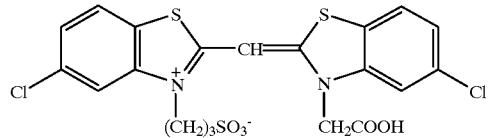

D-1

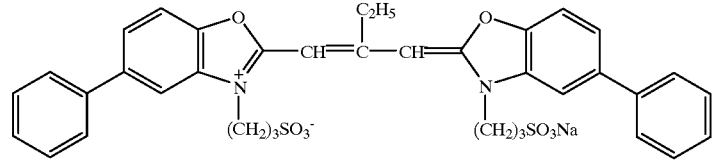

D-2

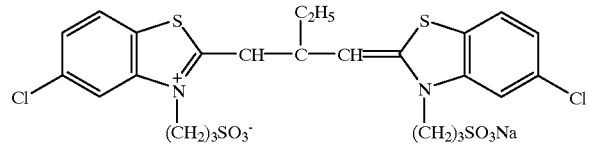

D-3

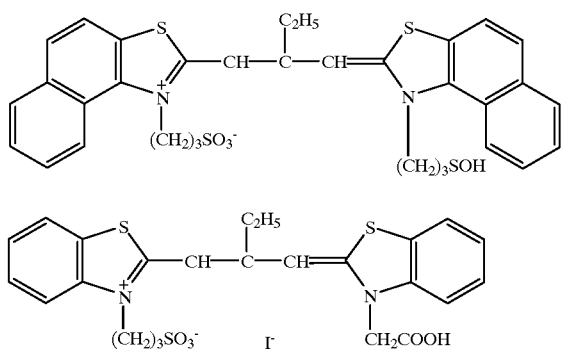

D-4

D-5

The above emulsions EM-B, EM-G and EM-R were used to prepare a color photographic light-sensitive material sample 1 comprised of the following component layers. The EM-B, EM-G, EM-R and EM-IR correspond to the Y, M, C and S emulsions in claim 1, respectively. The support was coated on the titanium oxide containing layer side with the following layers 1 to 8 and coated on the other side with a backing layer. In addition, coating aids SA-1 to SA-2 and hardeners H-1 and H-2 were used, whereby sample 1 was prepared. On preparing a coating emulsion, the emulsion was mixed with the infrared sensitive emulsion, which was contained in Layer 1, Layer 3 and Layer 7, immediately before the coating.

SA-1: Sodium sulfodi(2-ethylhexyl) succinate
SA-2: Sodium sulfodi(2,2,3,3,4,4,5,5 octafluoropentyl) succinate
H-1: Sodium 2,4-dichloro-6-hydroxy-s-triazine
H-2: Tetrakis(vinylsulfonylmethyl)methane

| Layer | Constitution | Coating wt(g/m$^3$) |
|---|---|---|
| Layer 8 (UV absorbing layer) | Gelatin | 0.78 |
| | UV absorbent UV-1 | 0.065 |
| | UV absorbent UV-2 | 0.120 |
| | UV absorbent UV-3 | 0.160 |
| | Oil soluble dye 1 | $0.5 \times 10^{-3}$ |
| | Oil soluble dye 2 | $0.5 \times 10^{-3}$ |
| | Solvent SO-2 | 0.1 |
| | Silica matting agent | 0.03 |
| Layer 7 (Blue-sensitive layer) | Gelatin | 1.43 |
| | Blue-sensitive emulsion EM-B (coating weight of silver) | 0.38 |
| | Infrared sensitive emulsion EM-IR (coating weight of silver) | 0.12 |
| | Yellow coupler YC-1 | 0.82 |
| | Antistain agent AS-2 | 0.025 |
| | Solvent SO-1 | 0.82 |
| | Strainers ST-1, ST-2, T-1 | each $0.15 \times 10^{-3}$ |
| Layer 6 (Intermediate layer) | Gelatin | 0.54 |
| | Anti-color-mixing agent (AS-1, AS-3, AS-4) in equal amount | 0.055 |
| | Solvent SO-2 | 0.072 |
| Layer 5 (Yellow colloidal layer) | Gelatin | 0.42 |
| | Yellow colloidal silver | 0.1 |
| | Anti-color-mixing agent (AS-1, AS-3, AS-4) in equal amount | 0.04 |
| | Solvent SO-2 | 0.049 |
| | Polyvinyl pyrrolidone PVP | 0.047 |
| Layer 4 (Intermediate layer) | Gelatin | 0.54 |
| | Anti-color-mixing agent (AS-1, AS-3, AS-4) in equal amount | 0.055 |
| | Solvent SO-2 | 0.072 |
| Layer 3 (Green-sensitive layer) | Gelatin | 1.43 |
| | Green-sensitive emulsion EM-G | 0.38 |
| | Infrared sensitive emulsion EM-IR (coating weight of silver) | 0.11 |
| | Magenta coupler MC-1 | 0.32 |
| | Yellow coupler YC-2 | 0.06 |
| | Antistain agent AS-2 | 0.019 |
| | Solvent SO-1 | 0.31 |
| | Strainers (ST-1, ST-2, T-1) | each $0.15 \times 10^{-3}$ |
| Layer 2 (Intermediate layer) | Gelatin | 0.75 |
| | Anti-color-mixing agent (AS-1, AS-3, AS-4) in equal amount | 0.055 |
| | Solvent SO-2 | 0.072 |
| | Antiirradiation dye (AI-1) | 0.03 |
| | Antiirradiation dye (AI-2) | 0.03 |
| Layer 1 (Red sensitive layer) | Gelatin | 1.38 |
| | Red-sensitive emulsion EM-R (Coating weight of silver) | 0.30 |
| | Infrared sensitive emulsion EM-IR (coating weight of silver) | 0.10 |
| | Cyan coupler CC-2 | 0.60 |
| | Solvent (SO-1) | 0.31 |
| | Antistain agent (AS-2) | 0.015 |
| | Strainers (ST-1, ST-2, T-1) | each $0.15 \times 10^{-3}$ |
| (Backing layer) | Silica matting agent | 0.65 |

The silver coating weight in above is in silver equivalent.

Sample 2 was prepared in the same manner as in Sample 1 above, except that the coating weight of infrared sensitive emulsion EM-IR in Layer 1, Layer 3 and Layer 7 was changed as shown below.

In the above obtained color photographic light-sensitive materials, samples 1 and 2, each one of the blue-sensitive, green-sensitive, red-sensitive and infrared-sensitive emulsions has a spectral sensitivity different from that of the other three emulsions and has a spectral sensitivity wavelength region at least six times higher than that in the wavelength region of the other three emulsions.

| Layer 7 | Infrared sensitive emulsion EM-IR | 0.40 |
|---|---|---|
| Layer 3 | Infrared sensitive emulsion EM-IR | 0.40 |
| Layer 1 | Infrared sensitive emulsion EM-IR | 0.30 |

SO-1: Trioctyl phosphate
SO-2: Dioctyl phthalate
AS-1: 2,4-di-t-octylhydroquinone
AS-2: 2,4-di-butylhydroquinone
ST-1: 1-(3-acetamidophenyl)-5-mercaptotetrazole
AT-2: N-benzyladenine -continued

UV-1, UV-2, UV-3, YC-1, YC-2, MC-1, CC-2, AI-1, AI-2, AS-3

AS-4
A mixture of the following three compounds:

Oil soluble dye 1

Oil soluble dye 2

The above-obtained Sample 1 was exposed to light under the following exposure condition-1 through a cyan image original and a black image original in close contact therewith, the cyan image original being closest to the light sensitive layer and the black image original being farthest from the light sensitive layer, then exposed to light under the following exposure condition-2 through a magenta image original and a black image original in close contact therewith, the magenta image original being closest to the light sensitive layer and the black image original being farthest from the light sensitive layer, then exposed to light under the following exposure condition-3 through a yellow image original and a black image original in close contact therewith, the yellow image original being closest to the light sensitive layer and the black image original being farthest from the light sensitive layer, and finally exposed to light under the following exposure condition-4 through only a black image original in close contact therewith. (Exposure condition A) Each of the above-obtained Samples 1 and 2 was exposed to light under the following exposure condition-1 through a cyan image original in close contact therewith, then exposed to light under the following exposure condition-2 through a magenta image original in close contact therewith, then exposed to light under the following exposure condition-3 through a yellow image original in close contact therewith, and finally exposed to light under the following exposure condition-4 through only a black image original in close contact therewith. (Exposure condition B) The resulting light sensitive material was processed according to the following processes to obtain a color dot image.

The density of the resulting image obtained was measured and is shown in Table 1. The density was measured using PD-65 produced by Konica Corporation. Table 1 shows densities of a portion corresponding to an original yellow image, a portion corresponding to an original magenta image, a portion corresponding to an original cyan image, a black image portion, a Y+M+C image portion, and a Y+M+C+B image. The 3% dot image of the black image of 175 line/inch was evaluated for dot quality. The evaluation criteria are as follows:

○ : Excellent dot image reproduction
× : Poor dot image reproduction

Exposure condition-1

Light-sensitive material sample was exposed through a red filter (Wratten No.26) and an ND filter to a white light for 0.5 seconds at a minimum exposure giving a minimum absolute value of red density variation after development due to exposure (logarithm) variation by varying the density of the ND filter.

Exposure condition 2

Light-sensitive material sample was exposed through a green filter (Wratten No.58) and an ND filter to a white light for 0.5 seconds at a minimum exposure giving a minimum absolute value of green density variation after development due to exposure (logarithm) variation by varying the density of the ND filter.

Exposure condition-3

Light-sensitive material sample was exposed through a blue filter (Wratten No.47B) and an ND filter to a white light for 0.5 seconds at a minimum exposure giving a minimum absolute value of blue density variation after development due to exposure (logarithm) variation by varying the density of the ND filter.

Exposure condition-4

Light-sensitive material sample was exposed under the above conditions in that order. The resulting exposed material was exposed through a infrared filter and an ND filter to a tungsten light for 0.5 seconds at a minimum exposure giving a minimum visible density after development due to exposure (logarithm) variation by varying the density of the ND filter.

The light source utilized for the above exposure conditions 1 to 3 was a daylight-type fluorescent lamp.

The resulting sample was processed according to the following process-1 (fresh processing). The fog processing was carried out as follows. The sample was immersed in a 3 mm thick developer and subjected to uniform overall exposure.

The sample 1 was running processed till developer replenisher was replenished three times the content of the developer tank in Process-1. Thereafter, samples were processed using the developer, bleach-fixer and stabilizer.

| Processing procedure-1 | Temperature | Time |
|---|---|---|
| Immersing in developer | 37° C. | 12 seconds |
| Light fogging | — | 12 seconds(1 lux) |
| Developing | 37° C. | 95 seconds |
| Bleach-fixing | 35° C. | 45 seconds |
| Stabilizing | 25–30° C. | 90 seconds |
| Drying | 60–85° C. | 40 seconds |

Compositions of the processing solutions (Color developer)

| | |
|---|---|
| Benzyl alcohol | 15.0 ml |
| Ceric sulfate | 0.015 g |
| Ethylene glycol | 8.0 ml |
| Potassium sulfite | 2.5 g |
| Potassium bromide | 0.6 g |
| Sodium chloride | 0.2 g |
| Potassium carbonate | 25.0 g |
| T-1 | 0.1 g |
| Hydroxylamine sulfate | 5.0 g |
| Sodium diethylenetriaminepentaacetate | 2.0 g |
| 4-amino-N-ethyl-N-(β-hydroxyethyl)aniline sulfate | 4.5 g |
| Brightening agent (4,4'-diaminostilbene-disulfonic acid derivative) | 1.0 g |
| Potassium hydroxide | 2.0 g |
| Diethylene glycol | 15.0 ml |
| Water to make 1 liter, adjust pH to 10.15. | |

Bleach-fixer

| | |
|---|---|
| Ferric ammonium diethylenetriaminepentaacetate | 90.0 g |
| Diethylenetrimainepentaacetic acid | 3.0 g |
| Ammonium thiosulfate (70% aqueous solution) | 180 ml |
| Ammonium sulfite (40% aqueous solution) | 27.5 ml |
| 3-mercapto-1,2,4-triazole | 0.15 g |
| Adjust pH to 7.1 with potassium carbonate or glacial acetic acid, | |
| Water to make 1 liter. | |

Stabilizer

| | |
|---|---|
| o-Phenylphenol | 0.3 g |
| Potassium sulfite (50% aqueous solution) | 12 ml |
| Ethylene glycol | 10 g |
| 1-hydroxyethylidene-1,1-diphosphonic acid | 2.5 g |
| Bismuth chloride | 0.2 g |
| Zinc sulfate, heptahydrate | 0.7 g |
| Ammonium hydroxide (28% aqueous solution) | 2.0 g |
| Polyvinylpyrrolidone K-17 | 0.2 g |
| Brightening agent (4,4'-diaminostilbene-disulfonic acid derivative) | 2.0 g |
| Water to make 1 liter. | |
| Adjust pH to 7.5 with ammonium hydroxide or sulfuric acid. | |

The stabilization treatment was made in the double bath countercurrent system.

The following are the prescriptions of replenishers necessary for conducting a continuous run of processings.

Color developer replenisher

| | |
|---|---|
| Benzyl alcohol | 18.5 ml |
| Ceric sulfate | 0.015 g |

-continued

| Color developer replenisher | |
|---|---|
| Ethylene glycol | 10.0 ml |
| Potassium sulfite | 2.5 g |
| Potassium bromide | 0.3 g |
| Sodium chloride | 0.2 g |
| Potassium carbonate | 25.0 g |
| T-1 | 0.1 g |
| Hydroxylamine sulfate | 5.0 g |
| Sodium diethylenetriaminepentaacetate | 2.0 g |
| 4-Amino-N-ethyl-N-(p-hydroxyethyl)aniline sulfate | 5.4 g |
| Brightening agent (4,42-diaminostilbene-disulfonic acid derivative) | 1.0 g |
| Potassium hydroxide | 2.0 g |
| Diethylene glycol | 18.0 ml |
| Water to make 1 liter, | |
| Adjust pH to 10.35. | |

Bleach-fixer replenisher

The same as the foregoing bleach-fix bath.

Stabilizer replenisher

The same as the foregoing stabilizing bath.

The replenishing amount of each of the developer replenisher, bleach-fixer replenisher and stabilizer replenisher was 320 ml per m² of light-sensitive material.

TABLE 1

| Originial Image | | Y | M | C | Black | | | Y + M + C | | | Y + M + C + B | | | 3% Dot Black Image |
|---|---|---|---|---|---|---|---|---|---|---|---|---|---|---|
| | | | | | Density | | | | | | | | | |
| No. | Exposure | Y | M | C | Y | M | C | Y | M | C | Y | M | C | (Observation) |
| 1 | A | 1.51 | 1.53 | 1.57 | 1.82 | 1.86 | 1.91 | 1.67 | 1.66 | 1.62 | 1.82 | 1.86 | 1.91 | X |
| 1 | B | 1.51 | 1.52 | 1.57 | 0.61 | 0.64 | 0.68 | 1.65 | 1.64 | 1.63 | 1.81 | 1.85 | 1.90 | X |
| 2 | B | 1.52 | 1.55 | 1.55 | 1.51 | 1.47 | 1.44 | 1.60 | 1.58 | 1.53 | 1.82 | 1.88 | 1.93 | ○ |
| Proof Print | | 1.56 | 1.55 | 1.45 | 1.53 | 1.49 | 1.47 | 1.60 | 1.55 | 1.48 | 1.89 | 1.85 | 1.83 | ○ |

As is apparent from Table 1, the samples of the invention have a density closer to the proof print in each of yellow, magenta, cyan, black, Y+M+C, and Y+M+C+B, and have excellent black small dot reproduction.

Regarding the optical density of the invention which EM-IR gives, in inventive Sample 2 Y was 1.36, M 1.32 and C 1.29, and in comparative sample 1 Y was 0.50, M 0.55 and C 0.57.

Example 2

Both surfaces of original paper of 80 g/m² basis weight for a photographic support were corona-discharged. The one surface was laminated with a high density polyethylene (specific gravity 0.94, MI=6.8) having a thickness shown below and containing anatase type titanium dioxide in an amount shown below according to an extrusion method, and the other surface (backing surface) with a two-layered polyethylene resin layer according to an extrusion method. The resulting support was pressed with a cleaning roll with a mat surface of 20° C. at a line pressure of 20 Kg/cm to obtain supports A and B for photographic prints.

| Support | TiO₂ Concentration (%) | Polyethylene layer thickness (μm) |
|---|---|---|
| A | 11% | 27 |
| B | 17% | 27 |

The backing surface of original paper of 80 g/m² basis weight for a photographic support was laminated with a polyethylene resin (an equivalent mixture of a low density polyethylene (specific gravity 0.918, MI=5) and a high density polyethylene (specific gravity 0.965, MI=7.0) according to an extrusion method to have a thickness of 20 μm, and the other surface was corona-discharged, coated with the following electron beam hardenable resin coating composition to have a thickness of 20 μm and then made smooth. The resulting support was placed in an electron beam irradiation apparatus substituted with nitrogen therein (oxygen concentration 200 ppm) and irradiated with an electron beam at a accelerated voltage of 200 KV and at absorbed dose of 3 Mrad to obtain a support having an electron beam hardened resin layer.

| Electron beam hardenable resin coating composition | |
|---|---|
| Rutile-type titanium dioxide | 50 weight parts |
| Electron beam hardenable resin | 49.8 weight parts |

The electron beam hardenable resin was a mixture of a triacrylate ester of pentaerythritolacrylic acid adduct with trimethylolpropane triacrylate.

The resulting support was designated as Support C.

The above obtained supports A to C were coated with the following constitution layers, whereby a multilayer silver halide color photographic light-sensitive material was prepared.

The emulsions EM-B, EM-G, EM-R and EM-UV prepared in Example 1 were used to prepare a color photographic light-sensitive material samples 21A to 21C. The EM-B, EM-G, EM-R and EM-UV correspond to the M, C, S and Y emulsions in claim 1, respectively. The supports A to C were coated on front side with the following Layers 1 to 8 and coated on the other side with the following Layer 9. In addition, coating aids SA-1 to SA-2 and hardeners H-1 and H-2 were used, whereby sample 1 was prepared. On preparing a coating emulsion, the emulsion was mixed with the infrared sensitive emulsion, which was contained in Layer 1, Layer 3 and Layer 7, immediately before the coating.

| Layer | Constitution | Coating wt(g/m³) |
|---|---|---|
| Layer 8 | Gelatin | 0.78 |
| (UV absorb- | UV absorbent (UV-1) | 0.065 |
| ing layer) | UV absorbent (UV-2) | 0.120 |
|  | UV absorbent (UV-3) | 0.160 |
|  | Oil soluble dye 1 | $0.5 \times 10^{-3}$ |
|  | Oil soluble dye 2 | $0.5 \times 10^{-3}$ |
|  | Solvent (SO-2) | 0.1 |
|  | Silica matting agent | 0.03 |
| Layer 7 | Gelatin | 1.43 |
| (Yellow-sensi- | UV sensitive emulsion BM-UV | 0.38 |
| tive layer) | Red sensitive emulsion EM-R | 0.40 |
|  | Yellow coupler (YC-1) | 0.82 |
|  | Antistain agent (AS-2) | 0.025 |
|  | Solvent (SO-1) | 0.82 |
|  | Strainers (ST-1, ST-2, ST-3) | each $0.15 \times 10^{-3}$ |
| Layer 6 | Gelatin | 0.54 |
| (Intermediate | Anti-color-mixing agent | 0.055 |
| layer) | (AS-1, AS-3, AS-4) in equal amount |  |
|  | Solvent (SO-2) | 0.072 |
| Layer 5 | Gelatin | 0.42 |
| (Yellow col- | Yellow colloidal silver | 0.1 |
| loidal layer) | Anti-color-mixing agent | 0.04 |
|  | (AS-1, AS-3, AS-4) in equal amount |  |
|  | Solvent (SO-2) | 0.049 |
|  | Polyvinyl pyrrolidone (PVP) | 0.047 |
| Layer 4 | Gelatin | 0.54 |
| (Intermediate | Anti-color-mixing agent |  |
| layer) | (AS-1, AS-3, AS-4) in equal amount | 0.055 |
|  | Solvent (SO-2) | 0.072 |
| Layer 3 | Gelatin | 1.43 |
| (Magenta- | Blue-sensitive emulsion EM-B | 0.38 |
| sensitive | Red sensitive emulsion EM-R | 0.40 |
| layer) | Magenta coupler (MC-1) | 0.32 |
|  | Yellow coupler (YC-2) | 0.06 |
|  | Antistain agent (AS-2) | 0.019 |
|  | Solvent (SO-1) | 0.31 |
|  | Restrainers (ST-1, ST-2, ST-3) | each $0.15 \times 10^{-3}$ |
| Layer 2 | Gelatin | 0.75 |
| (Intermediate | Anti-color-mixing agent |  |
| layer) | (AS-1, AS-3, AS-4) in equal amount | 0.055 |
|  | Solvent (SO-2) | 0.072 |
|  | Antiirradiation dye (AI-1) | 0.03 |
|  | Antiirradiation dye (AI-2) | 0.03 |
| Layer 1 | Gelatin | 1.38 |
| (Cyan sensi- | Green-sensitive emulsion EM-G | 0.30 |
| tive layer) | Red sensitive emulsion EM-R | 0.40 |
|  | Cyan coupler (CC-2) | 0.60 |
|  | Solvent (SO-1) | 0.31 |
|  | Antistain agent (AS-2) | 0.015 |
|  | Strainers (ST-1, ST-2, T-1) | each 0.15 $\times 10^{-3}$ |
| Layer 9 | Gelatin | 6.00 |
| (backing) | Silica matting agent | 0.65 |
| layer) |  |  |

The silver coating weight in above is in terms of silver.

ST-3 : 2-mercaptobenzothiazole

The following Layer 11 was provided between Layer 1 and the support in Sample 21A to obtain Sample 21D.

| Layer 11 | Gelatin | 1.50 |
|---|---|---|
| (white pigment layer) | Anatase type titanium dioxide | 0.35 |

Each of the above-obtained light sensitive material Samples 21A through 21D was exposed to light under exposure condition-21 shown later through a cyan image original in close contact therewith, then exposed to light under the following exposure condition-22 through a magenta image original in close contact therewith, then exposed to light under the following exposure condition-23 through a yellow image original in close contact therewith, and finally exposed to light under the exposure condition-24 through only a black image original in close contact therewith. The resulting light sensitive materials were processed in the same manner as in Example 1 to obtain a color image having a dot and a line.

The image portion corresponding to a rectangular image of a 10 μm line width in an original was measured with a microdensitometer. The thin line reproducibility was represented by a relative value of a difference between the maximum and minimum densities. The more the difference, the more excellent the thin line reproducibility.

Exposure condition 21

Light-sensitive material sample was exposed through a green filter (Wratten No.58) and an ND filter to a white light for 0.5 seconds at a minimum exposure giving a minimum absolute value of red density variation after development due to exposure (logarithm) variation by varying the density of the ND filter.

Exposure condition-22

Light-sensitive material sample was exposed through a blue filter (Wratten No.47B) and an ND filter to a white light for 0.5 seconds at a minimum exposure giving a minimum absolute value of green density variation after development due to exposure (logarithm) variation by varying the density of the ND filter.

Light-sensitive material sample was exposed through a UV filter transmitting 380 to 400 nm light and an ND filter to a white light for 0.5 seconds at a minimum exposure giving a minimum absolute value of blue density variation after development due to exposure (logarithm) variation by varying the density of the ND filter.

Exposure condition-24

Light-sensitive material sample was exposed under the above conditions 1 through 3 in that order. The resulting exposed material was exposed through a red filter (Wratten No. 26) and an ND filter to a tungsten light for 0.5 seconds at a minimum exposure giving a minimum visible density after development due to exposure (logarithm) variation by varying the density of the ND filter. The exposure only through a red filter is referred to as Exposure condition-24.

The light source utilized for the above exposure conditions 21 to 24 was a daylight-type fluorescent lamp. The light source utilized for the exposure condition 23 was a mercury lamp.

TABLE 2

| | Thin Line Image in Original | | | |
|---|---|---|---|---|
| Sample No. | Y | M | C | Black |
| Sample 21A | 100 | 100 | 100 | 100 |
| Sample 21B | 100 | 102 | 99 | 102 |
| Sample 21C | 135 | 137 | 139 | 149 |
| Sample 21D | 139 | 140 | 138 | 148 |

As is apparent from Table 2, in the inventive samples, samples having a white pigment containing layer of which the white pigment content is not less than 20% have particularly excellent thin layer reproducibility.

What is claimed is:

1. A silver halide color photographic material comprising a support and, provided thereon, a first silver halide emulsion layer comprising at least one yellow image forming silver halide emulsion, a second silver halide emulsion layer comprising at least one magenta image forming silver halide emulsion, and a third silver halide emulsion layer comprising at least one cyan image forming silver halide emulsion, wherein at least one of said first, second, and third silver halide emulsion layers further contains a fourth silver halide emulsion, each one of said first, second, third, and fourth silver halide emulsions has a spectral sensitivity wavelength having a sensitivity at least six times higher than that of the other three emulsions at said spectral wavelength, and said fourth silver halide emulsion gives an optical density after development of 0.7 or more, each of said first, second, third and fourth silver halide emulsions having a maximum spectral sensitivity wavelength different from any other.

2. The silver halide color photographic material of claim 1, wherein each of said first, second and third silver halide emulsions contains the fourth silver halide emulsion.

3. The silver halide color photographic material of claim 1, wherein said support is a reflective support having a reflective layer on the emulsion layer side, the reflective layer containing white pigment in an amount of 20 weight % or more based on the binder of the reflective layer.

4. The silver halide color photographic material of claim 3, wherein each of said first, second and third silver halide emulsions contains the fourth silver halide emulsion.

5. The silver halide color photographic material of claim 1, wherein the silver halide color photographic material is positive working silver halide photographic material.

6. The silver halide color photographic material of claim 2, wherein when said light-sensitive material is exposed to a specific light having a wavelength around said maximum spectral sensitivity wavelength of one of said first, second, third and fourth silver halide emulsions, one of said emulsions, which has a maximum spectral sensitivity wavelength around the wavelength of said specific light, has a sensitivity at least six times the sensitivity of the other three emulsions at said maximum spectral sensitivity wavelength.

* * * * *